United States Patent [19]

Ko et al.

[11] 4,433,471

[45] Feb. 28, 1984

[54] METHOD FOR THE FORMATION OF HIGH DENSITY MEMORY CELLS USING ION IMPLANTATION TECHNIQUES

[75] Inventors: Wen-Chuang Ko, San Jose; Robert L. Berry, Cupertino, both of Calif.

[73] Assignee: Fairchild Camera & Instrument Corporation, Mountain View, Calif.

[21] Appl. No.: 340,395

[22] Filed: Jan. 18, 1982

[51] Int. Cl.³ ............................................ H01L 21/74
[52] U.S. Cl. ................................... 29/578; 29/576 B; 357/35; 357/50; 357/91; 357/92; 148/1.5
[58] Field of Search ............. 29/576 B, 576 E, 577 C, 29/578, 580; 357/35, 50, 91, 92; 148/1.5

[56] References Cited

U.S. PATENT DOCUMENTS 4,168,999  9/1979  Vora et al. ........................ 29/571 X
4,198,649  4/1980  Berry ..................................... 357/50

Primary Examiner—Brian E. Hearn
Assistant Examiner—Alan E. Schiavelli
Attorney, Agent, or Firm—Kenneth Olsen; Carl Silverman; Alan H. MacPherson

[57] ABSTRACT

A semiconductor structure is fabricated using a process involving all ion implantation and using only five masks prior to metallization. A buried contact mask is used to form a buried contact layer (114), an isolation mask is used to form grooves (130a, 130b) in an epitaxial layer of silicon (113), a self-aligned transistor mask is used to form a mask (134a to 134e) to define the areas in which emitters (138a, 140b, 140c) bases (113, 139) and contact regions (140a) are to be formed, a base exclusion mask (135a,b) is provided to exclude certain impurities from being implanted into a region to be formed of one conductivity type, and a second exclusion mask (137a, 137b) is provided to exclude impurities to be implanted in a region of opposite conductivity type from the prohibited regions of the structure. The last ion implantation of the device is a two-level implantation to yield a shallow implant which provides good ohmic contact to certain to-be-formed metal contact areas and a deep implant to provide current gain control for the base of the NPN transistors ($Q_1$, $Q_2$). The metal contacts to active regions on the device are formed merely by etching the device to remove a thin oxide (131) over these regions. A thicker oxide (134a through 134e) overlying all other regions of the device is substantially unaffected by this etching.

9 Claims, 12 Drawing Figures

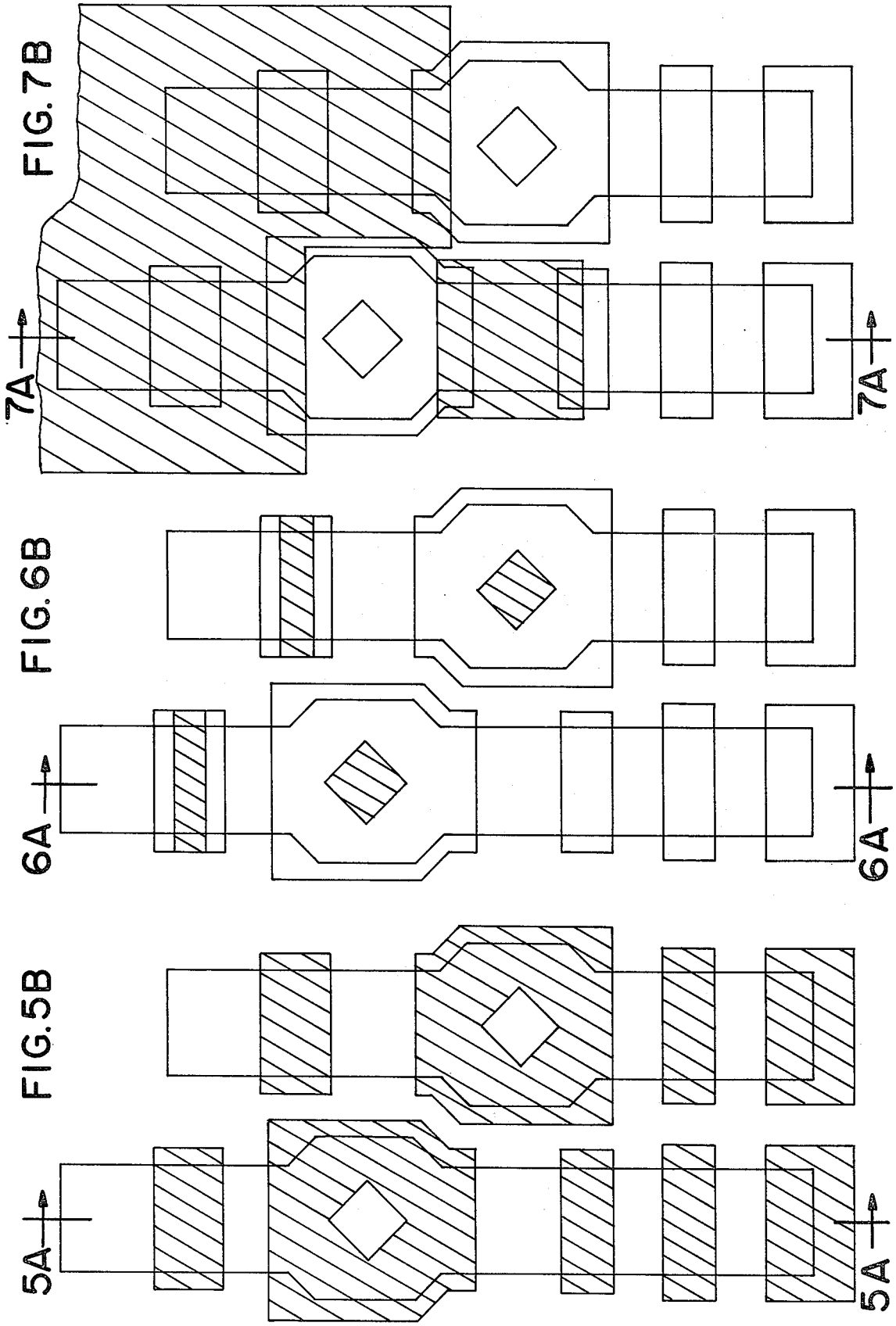

METHOD FOR THE FORMATION OF HIGH DENSITY MEMORY CELLS USING ION IMPLANTATION TECHNIQUES

BACKGROUND OF THE INVENTION

1. Field of the Invention

This invention relates to high-density random access memory cells and in particular to a process for making such structures with a reduction in the number of mask steps compared to the prior art.

2. Prior Art

One prior art oxide isolation technology commonly used for manufacturing 16K RAMs employs thirteen masking steps to fabricate memory cells with active loads comprising lateral PNP transistors. These masking steps comprise the buried layer mask, the PNP base mask, the isolation mask, the self-aligned transistor mask, the base exclusion mask, the PNP emitter mask, the etch back mask, the NPN base mask, the contact mask, the first metal mask, the dielectric mask, the second metal mask, and the top side mask. One circuit constructed using this technology (a cross-coupled memory cell) is shown in FIG. 2. Resistors R1 and R2 comprise bypass resistors which are fabricated on the sidewalls of the cell by a P type field diffusion as taught in U.S. Pat. Nos. 4,118,728 and 4,149,177, the disclosures of which are hereby incorporated herein by reference. FIG. 1A illustrates (prior to the formation of electrical interconnects) in cross-section one-half of the cross-coupled memory cell illustrated in FIG. 2 (shown after the formation of electrical interconnects). In FIG. 1A transistor Q3 comprises a lateral transistor comprising P+ emitter 11, N type base 13 and P+ type collector 12. Collector 12 is connected by conductive side walls of P type conductivity (as taught by the '728 and '177 patents) to P+ contact region 18. Region 18 also provides an electrical contact to the base of transistor Q1. The impedance of this side wall comprises the resistor R1 and this P type sidewall is connected via regions 17, 18 and 19 to the P type base region 20 of multiple emitter transistor Q1. One emitter of transistor Q1 comprises N+ region 21 and a second emitter of transistor Q1 comprises N+ type region 24. The base region 20 is connected to additional base region 23 by means of P type material 22. Low resistivity N+ type buried interconnect region 14, among other functions, connects the N type collector regions 26 and 27. Base region 13 of lateral transistor Q3 is connected to the collector regions 26 and 27 of multiple emitter transistor Q1 by N+ buried interconnect region 14. Contact to region 14 is made via N type region 30 through N+ contact region 16. Oxide isolation regions 15a and 15b are formed over P+ type channel stop region 28a and 28b formed in a conventional manner. The formation of oxide regions 15a and 15b is also well known in the semiconductor arts and thus will not be described in detail. Oxide isolation regions 15a and 15b actually form a single, annular isolation region when viewed from the top of the device and P+ channel stop regions 28a and 28b form a single, annular channel stop region beneath the annular oxide isolation region.

A plan view of the layout corresponding to the cell shown in cross-section in FIG. 1A is shown in top view in FIG. 1B. In FIG. 1B electrical contacts to the various transistors are identified by both the number of the transistor and the particular portion of the transistor contacted (a small e represents an emitter, a small b represents a base, and a small c represents a collector), as well as with the number of the corresponding regions of FIG. 1A. The structure shown in cross-section in FIG. 1A comprises one-half of the active devices of the cell of FIG. 2 with the other half being shown in top view to the right in FIG. 1B. Resistors R1 and R2 are shown as heavy bars in FIG. 1B. The wordline WL shown schematically in the top of FIG. 2 contacts the emitters of transistors Q3 and Q4 as shown in FIG. 1B. Resistor R1 connects the collector of lateral transistor Q3 to the base (contacted through base contact region 18 shown in FIG. 1A) of vertical transistor Q1 and thus to the collector of multiple emitter transistor Q2 through the topside metalization interconnect. The N type base of transistor Q3 is connected by means of a topside metal contact to the collector of transistor Q4 and by means of P type sidewall resistor R2 to the base of multiple emitter transistor Q2. Emitter e1 of Q2 (FIG. 1B) is connected to the word line WL and emitter e2 of Q2 is connected to the bit line $\overline{BL}$, which is the complement of the bit line BL. Likewise, the emitter e1 of transistor Q1 is connected to the word line WL and the emitter e2 of transistor Q1 is connected to the bit line BL. Resistor R1 connects the collector of transistor Q3 to the base of transistor Q1 by means of resistive sidewall conductive paths passing beside the N type epitaxial layer 30 (FIG. 1A) and insulated therefrom by a PN isolation junction and making contact to the base 20, 23 of NPN transistor Q1 through P type region 17, P+ type region 18 and P type region 19. The base region 20, 23 of Q1 is connected by means of a conductive layer on top of the circuit to the collector of Q2 and the base of lateral transistor Q4 (FIG. 1B).

The structure described above is one manufactured in the prior art by Fairchild Camera and Instrument Corporation and typically provides a memory cell of approximately one (1) sq. mil. While this cell represents the state of the art of bipolar technology, it still is not small enough to yield devices with a packing density required to make very large scale integrated circuits (VLSI structures).

SUMMARY

In accordance with this invention, an oxide isolation structure is provided which yields a substantial improvement in packing density and yield over the prior art devices, thereby making possible the fabrication of bipolar memory cells in accordance with very large scale integration packing densities. In accordance with this invention, the number of masks required to fabricate a circuit is reduced to nine. Elimination of the contact mask is achieved by the use of a thin oxide over regions to be contacted and a much thicker oxide between these regions. This allows removal of the oxide over the contact regions by etching the surface of the device for a time sufficient to remove the thin oxide overlying the contact regions while leaving substantially unaffected the thicker oxide. In accordance with this invention five (5) masks are used before metallization and ion implantations are used to form the emitter and base regions. As a feature of this invention the implantation process is simplified by using the same screening oxide during the implantation of both the base, emitter and collector regions. As another feature, a lateral PNP transistor is used as the active load.

DESCRIPTION OF THE DRAWINGS

FIG. 5B shows a top view of the structure of FIG. 5A with the cross-hatching representing self-aligned transistor oxide regions;

FIG. 6B shows a top view of the structure of FIG. 6A with the cross-hatching representing photo-resist;

FIG. 7B shows a top view of the structure of FIG. 7A with the cross-hatching representing photo-resist.

DETAILED DESCRIPTION

An embodiment of this invention will be described in detail. It should be understood that this description is for the purpose of illustration and not by way of limitation and that other embodiments of this invention will be obvious to those skilled in the art in view of this description.

Figure 3:
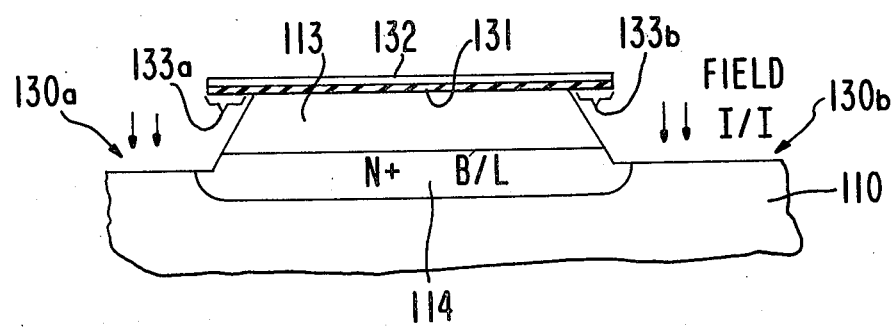
FIG. 3 illustrates one configuration of an intermediate structure manufactured in accordance with this invention during field implantation.
Figure 4:
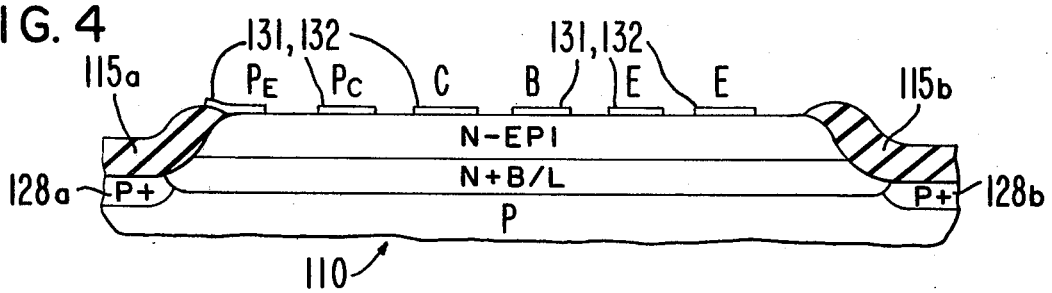
FIG. 4 illustrates in cross section the structure of this invention during the formation of the openings for the emitters and collectors of the PNP lateral transistor and the NPN vertical transistor made in accordance with this invention.

Turning now to FIGS. 3 and 4, the P type silicon substrate 110 having <100> crystal orientation is oxidized, patterned with a buried layer mask and then diffused with an N type impurity to form a buried layer 114 of N+ conductivity (see FIG. 3) for low resistance interconnection to the collector regions of the to-be-formed NPN transistor and the base region of the to-be-formed PNP transistor. A thin (approximately 1 to 1.5 microns) epitaxial layer 113 is then grown on the substrate 110 followed by the growth of a thin layer of thermal oxide 131 (200 to 300 Å) and the depositing of silicon nitride 132 from the decomposition of silane and ammonia (1000 to 1500 Å thick). The nitride, oxide and underlying silicon are selectively etched (portions not to be etched are protected by an isolation mask) to form isolation grooves (illustrated by grooves 130a, 130b in FIG. 3) to laterally define the islands of silicon material in which the active devices are to be formed. The etching conditions are adjusted (e.g. by the use of a buffered HF etch to remove exposed portions of oxide 131 as well as to undercut oxide 131 beneath the edge of the remaining nitride 132, prior to the etching of epitaxial layer 113 with a well-known silicon etch) to produce an overhang 133a, 133b of the dielectric layer to mask implanted ions during subsequent field implantation. A P type impurity such as boron is then implanted (45 KEV $BF_2^+$ to a dosage of 1 to $2 \times 10^{14} cm^{-2}$) into the field to serve as a channel stopper in a well-known manner. Channel stopper regions 128a and 128b as shown in FIG. 4 are the result of this implantation.

Figure 5A:
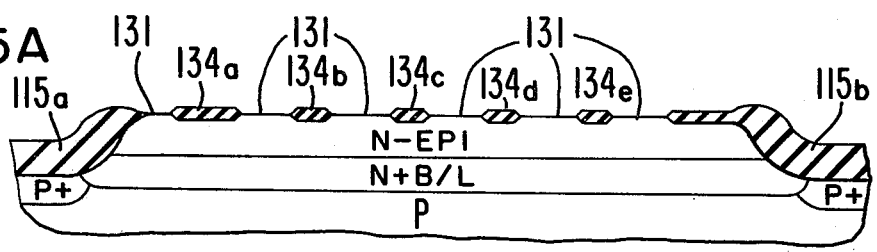
FIG. 5A illustrates the cross section of FIG. 4 after the formation of the oxide mask and removal of the nitride to define the collector and emitter implantation windows of the transistors in the to-be-formed memory cell.
Figure 6A:
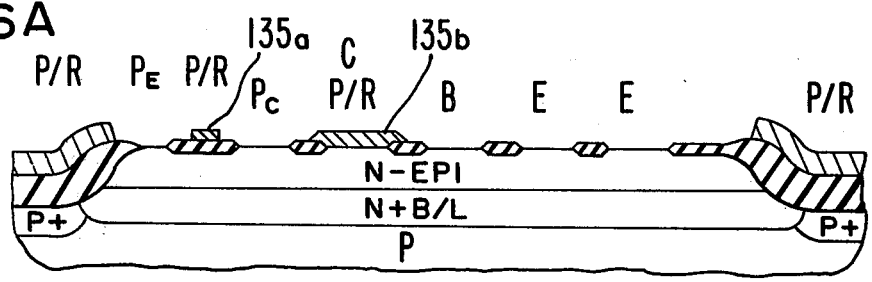
FIG. 6A illustrates a cross section showing the masking to protect the device during the implantation of a P type impurity.

The field region is then oxidized in a well-known manner to form isolation oxide 115a, 115b in grooves 130a and 130b. A self-aligned transistor mask is then applied to define the various components of the cell (the lateral PNP transistor and the vertical NPN transistors) by selectively removing the nitride layer 132 as shown in FIG. 4. The exposed oxide area is then oxidized (1500 to 2000 Å thick) to form the self-aligned transistor oxide 134a to 134e (FIGS. 5A, 5B). The nitride layer is then removed as shown in FIG. 5A leaving the thin 200 to 300 Å oxide layer 131 formerly under the nitride 132 and also leaving the thicker masking oxide 134a to 134e. A photoresist implant mask 135a,b (also called a "base exclusion mask") is then applied as shown in FIGS. 6A, 6B to protect the base and base contact of the lateral PNP (the base contact of the lateral PNP is also the contact to the collector of the vertical NPN) from implantation with a P type impurity such as boron. Boron ions are then implanted into the lateral PNP emitter and collector windows (labelled PE and PC respectively) and the NPN base contact window (labelled B), the bypass resistors (formed within epitaxial region 113 surrounding the to-be-formed sink contact region 140a of FIG. 8) and the NPN emitter windows (labelled E). Boron ions are also implanted through a self-aligned transistor oxide to form the interconnecting inactive base regions and self-aligned resistors. As a feature of this invention, a two-energy boron implantation is used to yield a shallow implant which provides good ohmic contact to the to-be-formed metal contact areas and a deep implant to provide current gain control for the base of the NPN transistors. The shallow implant uses B+ at 30 to 50 KEV with a dose of 1 to $2 \times 10^{14} cm^{-2}$ and a deep implant uses B+ at 80 to 150 KEV with a dose of 0.8 to $2.0 \times 10^{13} cm^{-2}$. Preferred energies and doses are for the shallow implant B+ at 50 KEV, $1 \times 10^{14} cm^{-2}$ and for the deep implant B+ at 120 KEV, $1.5 \times 10^{13} cm^{-2}$.

Figure 7A:
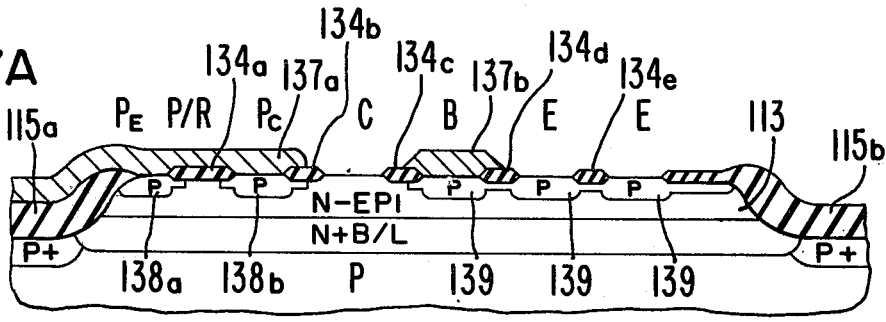
FIG. 7A illustrates the cross section of the structure during the formation of the collector sinks and emitter of the NPN vertical transistors of this invention.

Following removal of photoresist mask 135a,b, an arsenic implant photoresist mask 137a, 137b (FIGS. 7a, 7b) is applied to protect, in conjunction with the self aligned transistor oxide regions 134a to 134e, and field oxide 115a,b, the surface of the structure everywhere except for the collector sink contact window (labelled "C" in FIG. 7A) and the vertical NPN transistor emitter windows as shown in FIGS. 7A, 7B (labelled "E" in FIG. 7A). The arsenic implant mask 137a, 137b is stripped after arsenic implantation (using As+ at 40 to 120 KEV and 0.5 to $2.0 \times 10^{16} cm^{-2}$ with 80 KEV, $1 \times 10^{16} cm^{-2}$ preferred). A single heat cycle (1000° C. for twenty to eighty minutes in nitrogen) is then employed to anneal and drive in the implanted dopant. Contact windows are then opened by appropriate etching of the thin oxide layer 131 (shown in FIG. 3, but present in the process to this point) formed on the epitaxial layer 113. In one embodiment these contact windows are opened by dipping the wafer into an etch (such as buffered HF) for a time sufficient to remove oxide 131 but not sufficient to substantially change thicker oxide 134a to 134e. Thus, no contact mask is required. The substrate, as shown in FIG. 8, is then ready for metal evaporation for the formation of topside electrical interconnects.

In accordance with this invention, a total of nine masks are required as compared to a prior art process requiring thirteen masks, thus saving four masking steps and substantially increasing yield. The nine masks comprise buried layer mask, isolation mask, self-aligned transistor (SAT) mask, base exclusion mask, emitter mask (also called arsenic implant mask), metal 1 mask, via mask, metal 2 mask and top side mask.

Figure 1A:
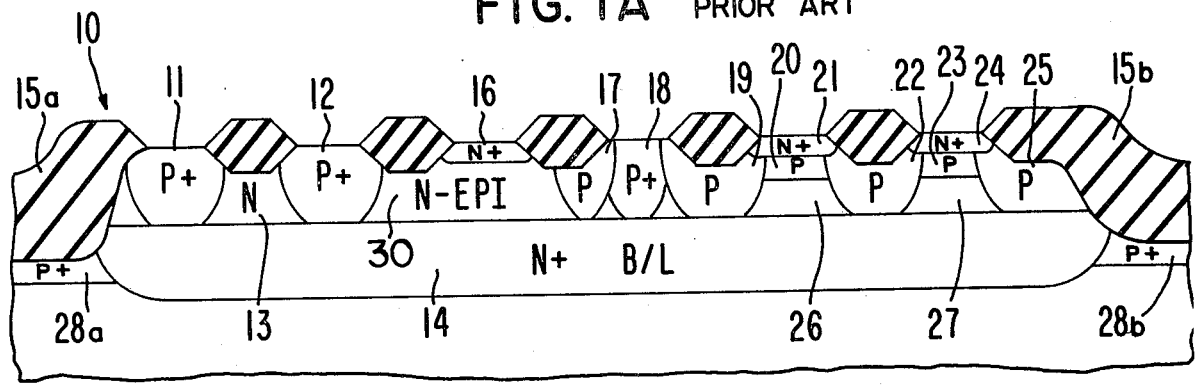
FIG. 1A shows in cross section a portion of a cross-coupled memory cell of the prior art prior to metallization.
Figure 1B:
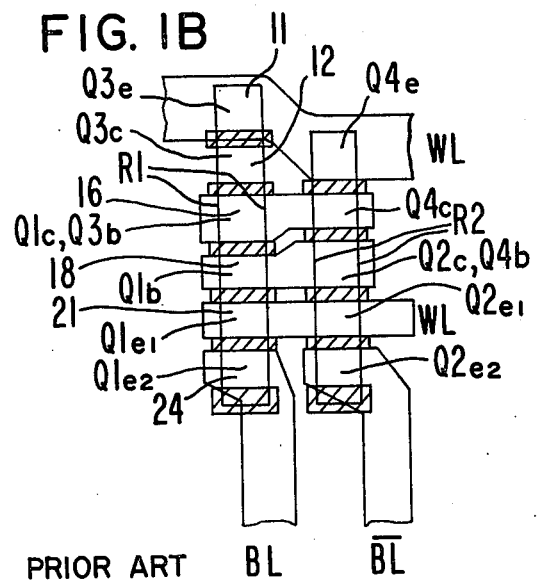
FIG. 1B illustrates in top view the layout of a prior art memory cell.
Figure 2:
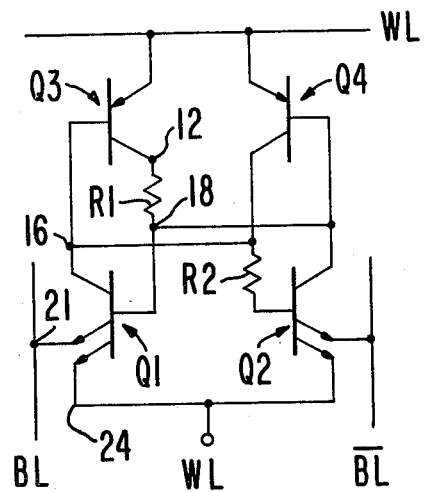
FIG. 2 shows the circuit schematic for the crosscoupled memory cell shown in top view in FIG. 1B and a portion of which is shown in cross section in FIG. 1A.
Figure 8:
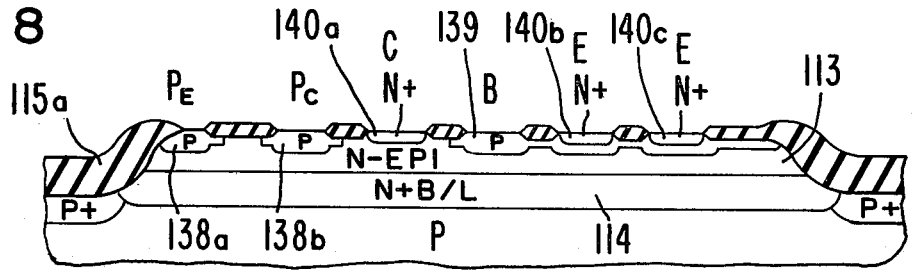
FIG. 8 illustrates the structure of FIG. 7A with the emitters of the NPN vertical transistors and the base contact to the PNP lateral transistor formed.

FIG. 8 shows the structure resulting from this invention. Emitter and collector regions 138a, 138b of the lateral PNP device are formed in a position analogous to the position of the comparable device in the prior art structure (FIG. 1). However, these P type regions do not extend all the way to the bottom of epitaxial region 113 as they do in the structure shown in FIG. 1A. The contact 140a to buried layer interconnect region 114 (through N type epitaxial layer 113) comprises an N+ region formed by arsenic implantation. This contact 140a also serves as a contact to the collector region 113 of the NPN vertical transistor comprising buried interconnect region 114, epitaxial collector 113, base region 139 and dual emitter regions 140b and 140c. Base region 139 is formed by the boron implantation simultaneously with the formation of the emitter and collector regions of the lateral PNP device. The dual emitter regions 140b and 140c are formed simultaneously with the contact region 140a by the arsenic implantation.

As disclosed in the copending application of Wen Chuang Ko, Ser. No. 313,875, entitled "Method for Forming Submicron Bipolar Transistors Without Epitaxial Growth and the Resulting Structure" assigned to Fairchild Camera and Instrument Corporation, the assignee of this application, filed on Oct. 22, 1981, and hereby incorporated by reference, the addition of a thin screening oxide (oxide 131 in FIG. 3) prior to the implantation of ions in the underlying semiconductor material results in a substantial reduction in the formation of dislocations in the underlying semiconductor material and thereby increases the yield. Following the ion implantation steps, the annealing of the wafer in nitrogen at 1,000° C. for a selected time varying from 20 to 80 minutes has been similarly found to increase the yield of the devices.

Other embodiments of this invention will be obvious to those skilled in the art in view of the above description. In certain situations the conductivity types of the structure disclosed can be reversed.

What is claimed is:

1. The method of forming a semiconductor structure comprising:
   forming a buried interconnect layer of a first conductivity type over a selected region of a substrate of a second conductivity type, said second conductivity type being opposite said first conductivity type;
   forming an epitaxial layer of said first conductivity type on said substrate such that a portion of said epitaxial layer overlies said buried interconnect layer;
   forming a thin first oxide layer on the top surface of said epitaxial layer;
   forming a nitride layer on said thin first oxide layer;
   forming grooves in portions of the epitaxial layer so as to form exposed recessed islands of semiconductor material;
   implanting a selected impurity into the exposed surface of said grooves thereby to form regions of said same conductivity type as said substrate but of higher impurity concentration than in said substrate to prevent leakage currents in the to-be-formed structure;
   oxidizing the silicon exposed by said grooves to form in said grooves second layers of thermally-grown silicon oxide to a selected thickness, said second layers of said thermally-grown silicon oxide directly contacting regions of said buried contact layer;
   removing selected portions of said nitride layer to expose regions of said thin first oxide layer covering portions of said island of semiconductor material in which further impurities of said first conductivity type are not to be added;
   oxidizing said wafer to form a relatively thick third oxide in those portions of semiconductor material covered by said regions of said thin first oxide layer exposed by the removal of portions of said nitride layer;
   removing all of the remainder of said nitride layer from said device;
   forming a base exclusion mask over said structure to prevent the implantation of impurities in the underlying semiconductor material covered by said base exclusion mask, said base exclusion mask covering at least the contact region to the buried interconnect layer and the base of the to-be-formed lateral transistor;
   ion implanting an impurity of said second conductivity type to form the emitter and collector of a lateral transistor and the base and base contact of a vertical transistor in those portions of said island of semiconductor material not covered by said base exclusion mask;
   removing the base exclusion mask and forming a second exclusion mask of a selected material thereby to prevent the further implantation of impurities in the emitter and collector of said lateral transistor and the base contact of said vertical transistor;
   ion implanting additional regions of first conductivity type in the regions covered by the thin first oxide and not covered by the second exclusion mask or said relatively thick third oxide, thereby to form the contact region to said buried interconnect layer and the emitters of a vertical transistor;
   removing the second exclusion mask from said structure; and
   etching the wafer for a sufficient time to remove the thin first oxide over the surface of the wafer but so as not to damage said second and third oxide, thereby to open selected contact areas to the active regions of said device.

2. The method of claim 1 wherein said lateral transistor comprises a lateral PNP transistor, said buried interconnect layer comprises an N type interconnect layer and said vertical transistor comprises a vertical NPN transistor.

3. The method of claim 2 wherein said vertical NPN transistor comprises a multiple emitter NPN transistor.

4. The method of claim 1 wherein said thin first oxide layer beneath the nitride layer comprises an oxide layer of between 200–300 Å thick; and said nitride layer comprises a deposited nitride layer of approximately 1,000–2,000 Å thick.

5. The method of claim 4 wherein said thin first oxide layer beneath the nitride layer is of sufficient thickness to allow the passage of ions during implantation into the underlying semiconductor material but to prevent dislocation of the underlying semiconductor material due to implantation.

6. The method of claim 1 wherein said impurity of a second conductivity type implanted during the first ion implantation step comprises a P type impurity and the impurity of the first conductivity type implanted following the application of the second exclusion mask comprises an N type inpurity.

7. The method of claim 6 wherein said N type impurity comprises arsenic.

8. The method of claim 1 wherein the step of ion implanting an impurity of said second conductivity type to form the emitter and collector of a lateral transistor and the base of a vertical transistor comprises a two energy boron implantation so as to yield a shallow implant to provide good ohmic contact to the to-be-formed metal contact areas and a deep implant to provide current gain control for the base of to-be-formed NPN transistors.

9. The method of claim 8 wherein the shallow implant is performed using boron ions at 30 to 50 KEV with a dose of 1 to $2 \times 10^{14}/cm^2$ and the deep implant uses boron ions at 80 to 150 KEV for a dose of 0.8 to $2.0 \times 10^{13}/cm^2$.

* * * * *